United States Patent
Mollov

(10) Patent No.: US 8,748,831 B2
(45) Date of Patent: Jun. 10, 2014

(54) FLAT PANEL IMAGERS WITH PIXEL SEPARATION AND METHOD OF MANUFACTURING THE SAME

(75) Inventor: Ivan P. Mollov, Mountain View, CA (US)

(73) Assignee: Varian Medical Systems, Inc., Palo Alto, CA (US)

( * ) Notice: Subject to any disclaimer, the term of this patent is extended or adjusted under 35 U.S.C. 154(b) by 182 days.

(21) Appl. No.: 13/323,288

(22) Filed: Dec. 12, 2011

(65) Prior Publication Data

US 2013/0146776 A1 Jun. 13, 2013

(51) Int. Cl.
*G01T 1/20* (2006.01)
*G03F 7/00* (2006.01)
*G03F 7/20* (2006.01)
*G01T 1/202* (2006.01)

(52) U.S. Cl.
CPC .......... *G01T 1/20* (2013.01); *G03F 7/0035* (2013.01); *G03F 7/20* (2013.01); *G01T 1/202* (2013.01)
USPC ........................................ 250/369

(58) Field of Classification Search
CPC ......... G01T 1/20; G01T 1/2006; G01T 1/202; G03F 7/0035; G03F 7/20
USPC ...................................... 250/369
See application file for complete search history.

(56) References Cited

U.S. PATENT DOCUMENTS

| 5,994,157 | A * | 11/1999 | Aggas et al. | 438/30 |
| 6,298,113 | B1 * | 10/2001 | Duclos et al. | 378/19 |
| 6,534,773 | B1 * | 3/2003 | Iwanczyk et al. | 250/370.11 |
| 2004/0024300 | A1 | 2/2004 | Graf | |
| 2005/0084073 | A1 | 4/2005 | Seppi et al. | |
| 2012/0267539 | A1 * | 10/2012 | Shinba et al. | 250/366 |

FOREIGN PATENT DOCUMENTS

WO WO 2011074249 A1 * 6/2011

OTHER PUBLICATIONS

Warren W. Flack, et al. "Process Characterization of One Hundred Micron Thick Photoresist Films", SPIE Microlithography, 1999, #3678-49, 17 pages.
Vivek V. Nagarkar, et al. "New design of a structured CsI(TI) screen for digital Mammography", Physics of Medical Imaging, Proceedings of SPIE vol. 5030, 2003, 6 pages.

* cited by examiner

*Primary Examiner* — Marcus Taningco
(74) *Attorney, Agent, or Firm* — Vista IP Law Group, LLP

(57) ABSTRACT

A method of making at least a portion of an imager includes obtaining an imager component having a substrate layer, a photo-sensitive layer, and a first image element and a second image element disposed between the substrate layer and the photo-sensitive layer, and delivering ultraviolet light through the substrate layer and between the first image element and the second image element to reach the photo-sensitive layer, wherein the ultraviolet light interacts with a portion of the photo-sensitive layer to form a photo-resist structure.

24 Claims, 6 Drawing Sheets

FLAT PANEL IMAGERS WITH PIXEL
SEPARATION AND METHOD OF
MANUFACTURING THE SAME

FIELD

This application relates generally to imagers, and manufacturing method for imagers.

BACKGROUND

Radiation has been employed for diagnostic purposes. For example, radiation may be used in an x-ray procedure or a CT procedure to obtain images of a patient. Radiation has also been employed to treat tumorous tissue. In radiation therapy, a high energy beam is applied from an external source towards the patient. The external source, which may be rotating (as in the case for arc therapy), produces a collimated beam of radiation that is directed into the patient to the target site. Sometimes, in radiation therapy, the high energy radiation may also be used for imaging the patient.

When using radiation for imaging purposes, an imager is provided to receive the radiation, which generates image signals in response to the received radiation. For example, in one type of imager, a layer of scintillating material is provided to receive the radiation. The scintillating material converts the radiation into light during use, and the imager circuits then generates electrical signals in response to the light.

Applicant of the subject application determines that new imagers and new methods of making the same would be desirable.

SUMMARY

In accordance with some embodiments, a method of making at least a portion of an imager includes obtaining an imager component having a substrate layer, a photo-sensitive layer, and a first image element and a second image element disposed between the substrate layer and the photo-sensitive layer, and delivering ultraviolet light through the substrate layer and between the first image element and the second image element to reach the photo-sensitive layer, wherein the ultraviolet light interacts with a portion of the photo-sensitive layer to form a photo-resist structure. By means of non-limiting example, the photo-resist structure may be a permanent structure.

In accordance with other embodiments, an imager includes a substrate, an imaging layer above the substrate, wherein the imaging layer comprises a first image element and a second image element, and a scintillating layer above the imaging layer, wherein the scintillating layer includes a plurality of walls that are in a grid configuration, and a plurality of scintillating blocks that are disposed in respective spaces between the walls.

In accordance with other embodiments, a method of making at least a portion of an imager includes obtaining an imager component having a substrate layer, a photo-sensitive layer, and an imaging layer having a first image element and a second image element disposed between the substrate layer and the photo-sensitive layer, and using the imaging layer as a mask to deliver ultraviolet light therethrough to reach the photo-sensitive layer to obviate a need to align a separate mask relative to the imager, wherein the ultraviolet light interacts with a portion of the photo-sensitive layer to form a photo-resist structure.

In accordance with other embodiments, an imager includes a substrate, an imaging layer above the substrate, wherein the imaging layer comprises a first image element and a second image element, a scintillating layer above the imaging layer, wherein the scintillating layer comprises a first scintillating portion and a second scintillating portion that correspond with the first and second image elements, respectively, and means for separating the first and second scintillating portions.

Other and further aspects and features will be evident from reading the following detailed description of the embodiments.

BRIEF DESCRIPTION OF THE DRAWINGS

The drawings illustrate the design and utility of embodiments, in which similar elements are referred to by common reference numerals. These drawings are not necessarily drawn to scale. In order to better appreciate how the above-recited and other advantages and objects are obtained, a more particular description of the embodiments will be rendered, which are illustrated in the accompanying drawings. These drawings depict only typical embodiments and are not therefore to be considered limiting of its scope.

DESCRIPTION OF THE EMBODIMENTS

Figure 1:
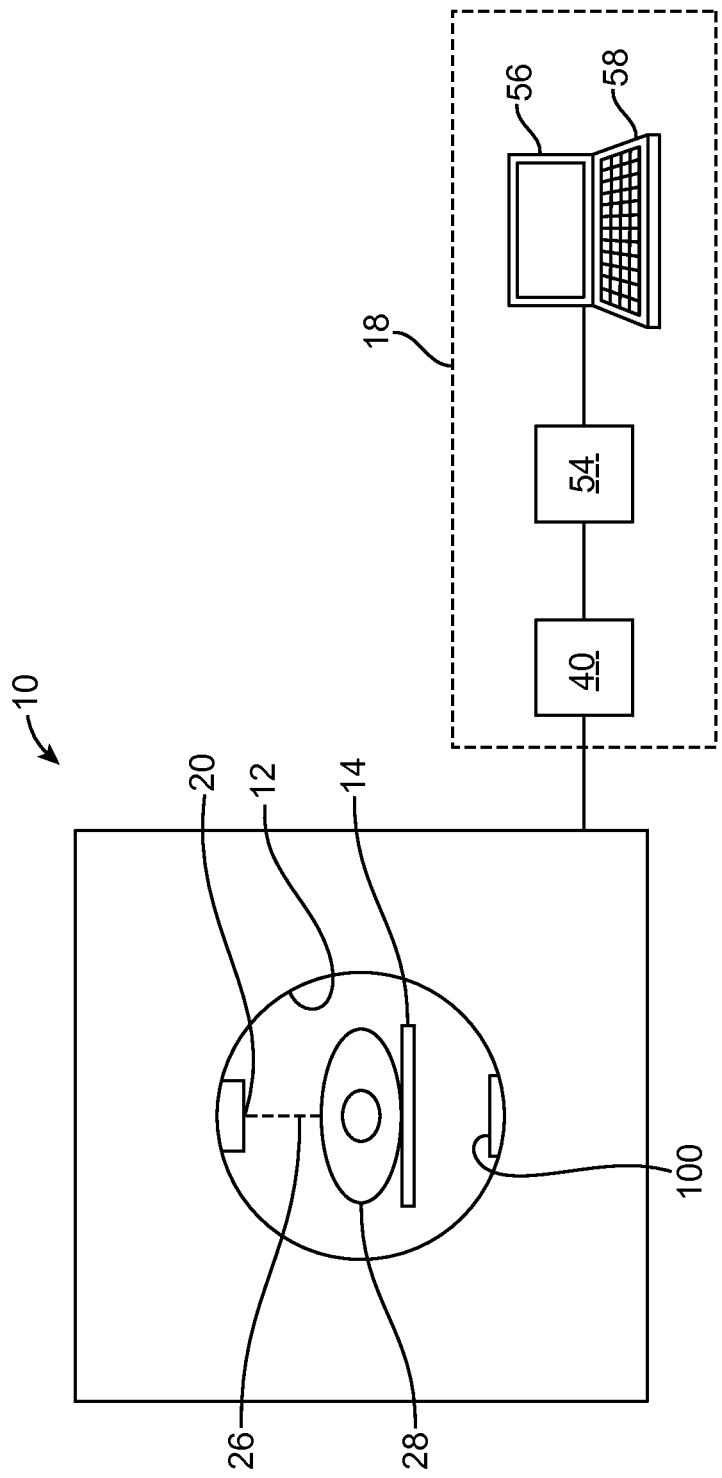
FIG. 1 illustrates a system for delivering radiation in accordance with some embodiments.

Various embodiments are described hereinafter with reference to the figures. It should be noted that the figures are not drawn to scale and that elements of similar structures or functions are represented by like reference numerals throughout the figures. It should also be noted that the figures are only intended to facilitate the description of the embodiments. They are not intended as an exhaustive description of the invention or as a limitation on the scope of the invention. In addition, an illustrated embodiment needs not have all the aspects or advantages shown. An aspect or an advantage described in conjunction with a particular embodiment is not necessarily limited to that embodiment and can be practiced in any other embodiments even if not so illustrated.

FIG. 1 illustrates a radiation system 10 that includes an imager in accordance with some embodiments. The system 10 includes a gantry 12, a patient support 14 for supporting a patient 28, and a control system 18 for controlling an operation of the gantry 12. The system 10 also includes a radiation source 20 that projects a beam 26 of radiation towards the patient 28 while the patient 28 is supported on support 14, and an imager 100 located at an operative position relative to the source 20 (e.g., under the support 14). The radiation source 20 can be configured to generate a cone beam, a fan beam, or other types of radiation beams in different embodiments.

In the illustrated embodiments, the radiation source 20 is a diagnostic radiation source for providing diagnostic energy. In such cases, the imager 100 is configured to receive diagnostic radiation and generate image signals in response thereto. In other embodiments, in addition to being a diagnostic radiation source, the radiation source 20 is also a treatment radiation source for providing treatment energy. In such cases, the imager 100 is configured to selectively receive diagnostic radiation or treatment radiation and generate image signals in response thereto. In further embodiments, instead of being a diagnostic radiation source, the radiation source 20 is a treatment radiation source. In such cases, the imager 100 is configured to receive treatment radiation and generate image signals in response thereto. In the embodiments in which the radiation source 20 is configured to deliver treatment radiation, the system 10 may optionally further include a collimator for changing a characteristic (e.g., shape) of the radiation beam.

In some embodiments, the treatment energy is generally those energies of 160 kilo-electron-volts (keV) or greater, and more typically 1 mega-electron-volts (MeV) or greater, and diagnostic energy is generally those energies below the high energy range, and more typically below 160 keV. In other embodiments, the treatment energy and the diagnostic energy can have other energy levels, and refer to energies that are used for treatment and diagnostic purposes, respectively. In some embodiments, the radiation source 20 is able to generate X-ray radiation at a plurality of photon energy levels within a range anywhere between approximately 10 keV and approximately 20 MeV. Radiation sources capable of generating X-ray radiation at different energy levels are described in U.S. patent application Ser. No. 10/033,327, entitled "RADIOTHERAPY APPARATUS EQUIPPED WITH AN ARTICULABLE GANTRY FOR POSITIONING AN IMAGING UNIT," filed on Nov. 2, 2001, and U.S. patent application Ser. No. 10/687,573, entitled "MULTI-ENERGY X-RAY SOURCE," filed on Oct. 15, 2003. In the illustrated embodiments, the radiation source 20 is coupled to a ring gantry and is located within a bore. In other embodiments, the radiation source 20 may be coupled to an arm gantry.

In the illustrated embodiments, the control system 18 includes a processor 54, such as a computer processor, coupled to a control 40. The control system 18 may also include a monitor 56 for displaying data and an input device 58, such as a keyboard or a mouse, for inputting data. In the illustrated embodiments, the gantry 12 is rotatable about the patient 16, and during an imaging and/or a treatment procedure, the gantry 12 rotates about the patient 28 (as in a CT procedure and/or an arch-therapy). In other embodiments, the gantry 12 does not rotate about the patient 28 during a procedure. In such case, the gantry 12 may be fixed, and the patient support 14 is rotatable. The operation of the radiation source 20 and the gantry 12 (if the gantry 12 is rotatable) are controlled by the control 40, which provides power and timing signals to the radiation source 20 and the collimator system 22, and controls a rotational speed and position of the gantry 12, based on signals received from the processor 54. Although the control 40 is shown as a separate component from the gantry 12 and the processor 54, in alternative embodiments, the control 40 can be a part of the gantry 12 or the processor 54.

It should be noted that the imager 100 is not limited to being used with the system 10 described above, and that the imager 100 may be applicable to other systems having other configurations in other embodiments. For example, in other embodiments, the imager 100 may be applicable for other systems that have different shapes. In other embodiments, the imager 100 may work with the radiation source 20 of the system 10 that have different ranges of motions and/or degrees of freedom. For example, in other embodiments, the radiation source 20 may be rotatable about the patient 28 completely through a 360° range, or partially through a range that is less than 360°. Also, in other embodiments, the radiation source 20 is translatable relative to the patient 28, and therefore, the imager 100 may work with a translatable radiation source. In still further embodiments, the imager 100 may be a part of any imaging system (e.g., x-ray system) or a part of any system (e.g., treatment system) that has imaging capability.

Figure 2:
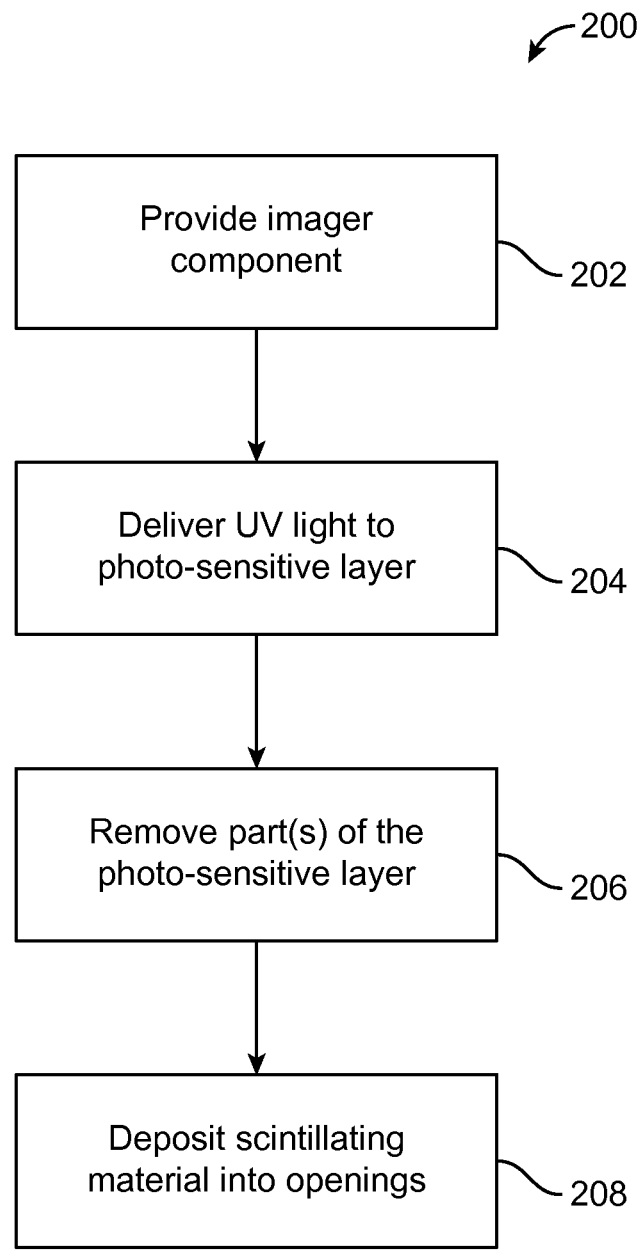
FIG. 2 illustrates a method of making an imager in accordance with some embodiments.
Figure 3A:
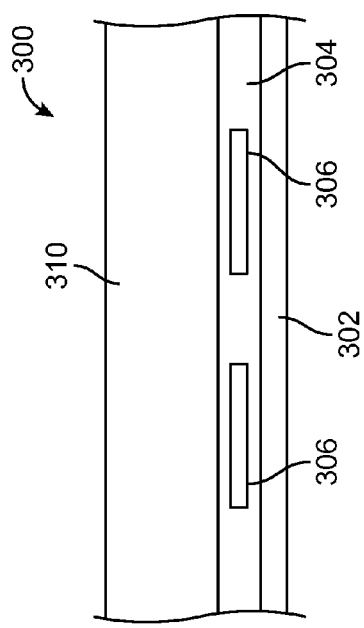
FIGS. 3A-3D illustrates the method of FIG. 2 being performed on a part of an imager that has two rows/columns of image elements.

FIG. 2 illustrates a method 200 of making an imager in accordance with some embodiments. The imager may be a flat panel, or any of other types of detectors. First an imager component is provided (Item 202). In the illustrated embodiments, the imager component 300 includes a substrate layer 302, an imaging layer 304 having a plurality of image elements 306 coupled to the substrate layer 302, and a photo-sensitive layer 310 on top of the imaging layer 304 (FIG. 3A). The photo-sensitive layer 310 is sensitive to light, which may be applied to interact with the layer 310 during the method 200 to make the imager. In some embodiments, the layer 310 may be liquid, in which case, it may be applied by dipping, spinning, extruding, and/or using silkscreen. In other embodiments, the layer 310 may be pre-manufactured as a film that is then applied to a surface of the image sensor(s). The substrate layer 302 is at least partially transparent to ultraviolet light. The substrate layer 302 may be glass, or other materials. The image elements 306 are photodiodes, or may be any of other types of imaging elements that are capable of generating image signals.

The photo-sensitive layer 310 is photo-sensitive to ultraviolet light, and is configured to cure/harden in response to reaction with ultraviolet light. In other embodiments, the photo-sensitive layer 310 may be photo-sensitive to other part(s) of the light spectrum (which may be visible or not). In the illustrated embodiments, the photo-sensitive layer 310 is a negative photo-resist element. In some embodiments, the photo-sensitive layer 310 may be configured to reflect or absorb a first part of a light spectrum while being transparent to a second part of the light spectrum. By means of non-limiting examples, the first part of the light spectrum may be green light, and the second part of the light spectrum may be the rest of the spectrum (including visible and non-visible light). In some cases, the photo-sensitive layer 310 may include a filler that allows the layer 310 to reflect or absorb a first part of a light spectrum (e.g., green light) while being transparent to a second part of the light spectrum. In one implementation, the layer 310 is transparent to ultraviolet light before it is cured, and is capable of absorbing or reflecting green light after it is cured. The photo-sensitive layer 310 may be implemented using any suitable material, including but not limited to SU-8 (which is an epoxy negative photo-resist), NR9-8000, AZ PLP-100. Examples of SU-8 that may be used includes SU-8 2025, SU-8 2035, SU-8 2050, and SU-8 2075, which may all be considered to be members of SU-8 2000.

Figure 3B:
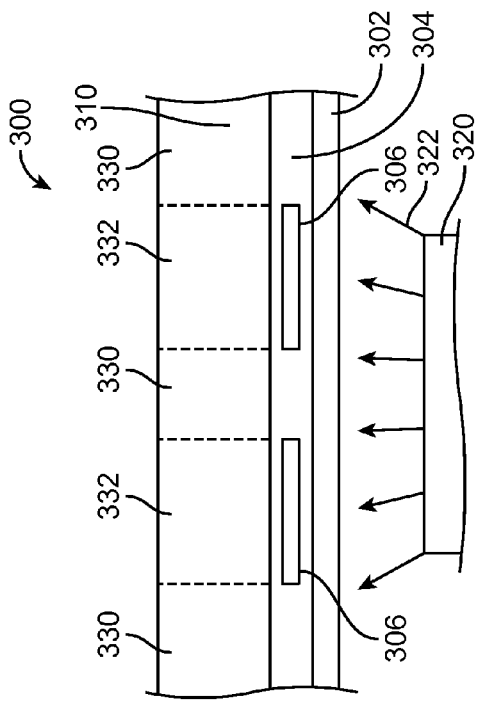

Returning to FIG. 2, next, an ultraviolet light is delivered to the photo-sensitive layer 310 to cure/harden the photo-sensitive layer 310 (Item 204). As shown in FIG. 3B, in the illustrated embodiments, an ultraviolet light source 320 delivers the ultraviolet light 322 through the substrate layer 302 and between the image elements 306 at the imaging layer 304 to reach the photo-sensitive layer 310. Such technique allows the image elements 306 at the imaging layer 304 to act as a mask that blocks some of the ultraviolet light 322 while allowing the rest of the ultraviolet light 322 to pass between the image elements 306 to reach the photo-sensitive layer 310. As a result, part(s) 330 of the photo-sensitive layer 310 receives the ultraviolet light 322, and other part(s) 332 of the photo-sensitive layer 310 does not. The part(s) 330 of the photo-sensitive layer 310 that receives the ultraviolet light 322 will get cured/hardened in response to its interaction with the ultraviolet light 322.

It should be noted that the curing/hardening of the material in the layer 310 may be accomplished using other techniques in other embodiments. For example, in other embodiments, the curing/hardening of the material may occur during a polymerization process, which may or may not involve use of ultraviolet light. If light is not used in the curing/hardening process, then the layer 310 may not be photo-sensitive in some embodiments.

Figure 3C:
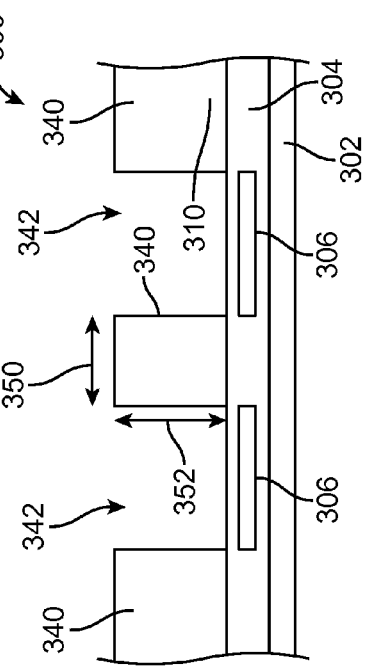

Returning to FIG. 2, next, the uncured/unhardened part(s) 332 of the photo-sensitive layer 310 is removed from the layer 310 (Item 206). As shown in FIG. 3C, the removal of the part(s) 332 of the photo-sensitive layer 310 creates walls 340 with openings 342 adjacent thereto. In the illustrated embodiments, each wall 340 has a width 350 and a height 352 measured in a direction perpendicular to a plane of the imager component 300 that is at least half the width 350, and more preferably, at least two times, and even more preferably, at least three times, that of the width 350. In some embodiments, the height 352 of each wall 340 may be anywhere from 2 um to 600 um, and more preferably, anywhere from 4 um to 100 um. In other embodiments, the height 352 may be more than 600 um. The height 352 may depend on the size of the image pixel in some embodiments. Although several walls 340 are shown at a cross section of the imager component 300, it should be understood that the imager component 300 also includes walls extending in a direction that is perpendicular to that shown in the figure. This is because the imager component 300 has image elements 306 that are arranged in two-dimension (e.g., in rows and columns) to form a matrix, and therefore, when the area above each image element 306 is removed from the layer 310, the remaining portion of the layer 310 will become a plurality of walls extending in two perpendicular directions. Thus, the walls 340 may collectively form a grid configuration, wherein at least two of the intersecting wall may have a unity configuration. The removal of the uncured/unhardened part(s) 332 of the photo-sensitive layer 310 may be performed using a chemical wash, laser, a mechanical device, etching, or other techniques known in the art.

Figure 3D:
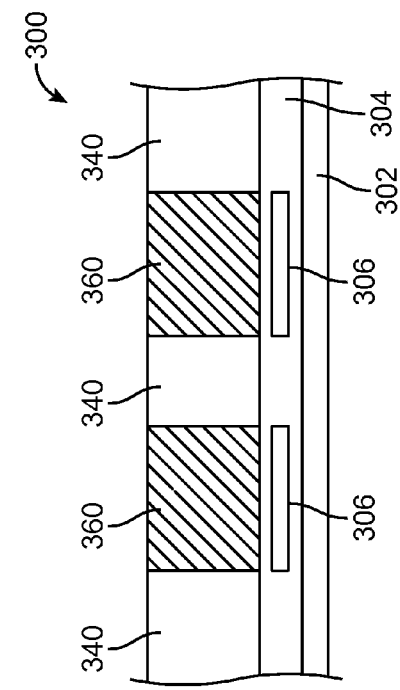
Figure 4B:
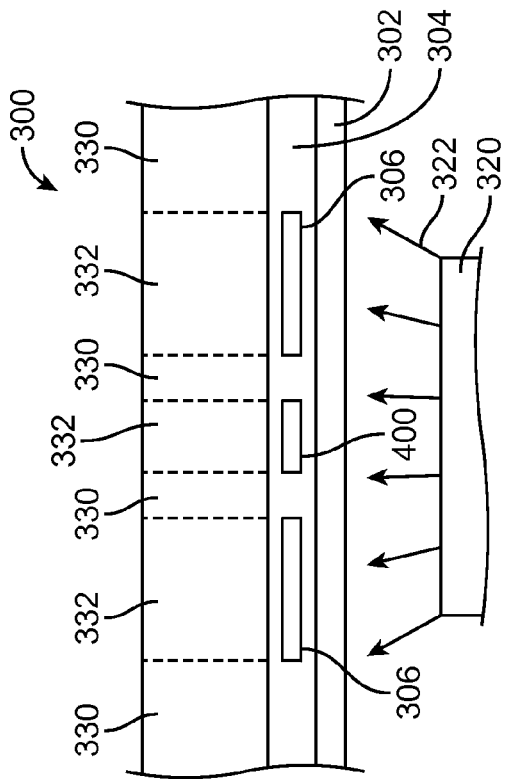
FIGS. 4A-4D illustrates the method of FIG. 2 being performed on a part of an imager that has a conductor between two rows/columns of image elements.
Figure 4D:
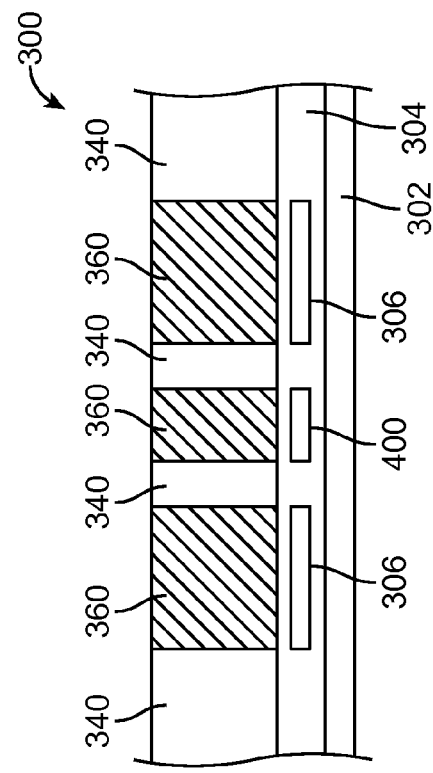
Figure 4A:
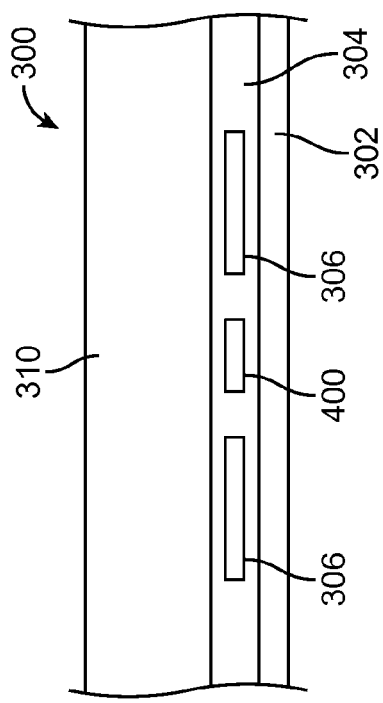
Figure 4C:
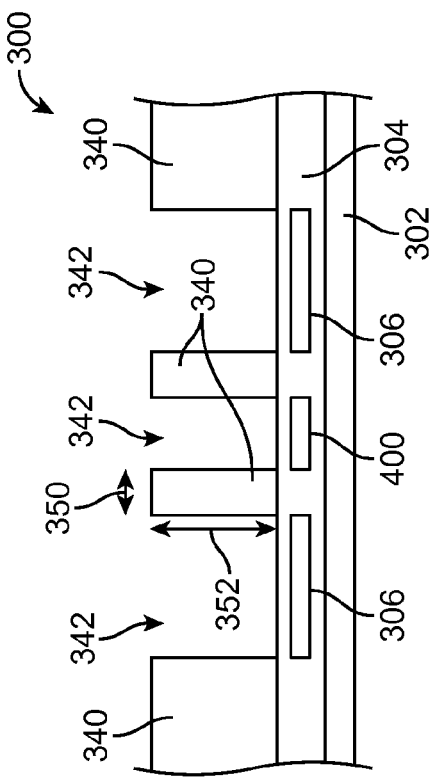

Returning to FIG. 2, next, scintillating material is then deposited into the openings 342 next to the walls 340 at the layer 310 (Item 208). Scintillating material is any material that is capable of converting x-ray into visible light. As shown in FIG. 3D, the scintillating material 360 is deposited into the openings 342 next to the walls 340. Each scintillating material 360 is above a corresponding image element 306 and is at least partially confined by the walls 340. The scintillating material 360 is above the corresponding image element 306 because the image element 306 functioned as a self-aligned mask previously that allows the opening 342 above it to be created. Although two scintillating materials 360 are shown in the figure, it should be understood that in other embodiments, the imager 300 may include more than two scintillating materials 360 in a row/column of the imager 300. Also, because the imager 300 has image elements 306 that are arranged in two-dimension (e.g., in rows and columns to form a matrix), it should be understood that in some embodiments, the scintillating materials 360 may be arranged in two-dimension (e.g., in rows and columns to form a matrix). Also, in some embodiments, the scintillating material may be applied as a continuous layer with portions of the continuous layer being deposited into respective spaces that are above the corresponding image elements 306. In the illustrated embodiments, the top of the scintillating material 360 is aligned with the top of the walls 340 so that they collectively form a continuous surface. In other embodiments, the top of the scintillating material 360 may be lower than the top of the walls 340. In further embodiments, the top of the scintillating material 360 may be higher than the top of the walls 340, in which cases, the top of the scintillating material 360 will form a layer that spread across the top of the walls 340.

In some embodiments, after the photo sensitive layer 310 has been cured/hardened, the resulting material forming the walls 340 may prevent light from transmitting therethrough, so that light in each scintillator well is prevented from travelling to adjacent scintillator well (to prevent pixel-to-pixel photo leaking and noise). Also, in some embodiments, the side walls 340 defining the opening 342 may be reflective (e.g., by depositing a material that is reflective to light at surfaces of the walls 340), to thereby improve a signal-to-noise ratio of the imager. In some cases, the bottom of the well is not reflective to light, so that light from within the scintillator well may exit through the bottom of the well to reach the image elements 306 (e.g., photo-sensing element(s)) of the imager.

During use of the imager 300, a radiation source delivers radiation towards a patient, and radiation exiting the patient reaches the scintillating materials 360 at the imager 300. The scintillating materials 360 converts radiation into visible light, which is then detected by the image elements 360 that are below respective scintillating materials 360. The image elements 360 then generate electrical signals in response to the light signals that are received from the scintillating materials 360. The walls 340 between the scintillating materials 360 functions as a photo-resist element that block at least part of the light (e.g., green light) from the scintillating materials 360. Thus, the walls 340 prevent any "cross-talk" between the scintillating materials 360. This has the benefit of producing image that has higher resolution (compared to one that is produced by an imager without the walls 340).

As shown in the above embodiments, the method 200 is advantageous because by using the image elements 306 themselves as a mask for filtering the ultraviolet light, it obviates the need to create and use a separate mask, and the need to align the separate mask relative to the imager component 300. Creation of a separate photo mask is expensive. Use of a separate mask is also expensive, involves use of expensive and cumbersome lithography equipment, and involves step-and-repeat process that takes time. Thus, in the method 200 of manufacturing the imager, the masking is self-aligned. Such technique is inexpensive and convenient to implement, and is effective in preventing the ultraviolet light from reaching the part of the photo-sensitive layer 310 that is above each image element 306. The method 200 is also advantageous because it allows the imager to be processed outside a clean room where it is manufactured.

In some cases, the imager component 300 may include a conductor that is disposed between two image elements 306 (e.g., between two rows or two columns of image elements 306). Such conductor may be a bias line, a signal line, or a data line. However, the method 200 may still be used to create walls 340 that separate the scintillating materials 360. FIGS. 4A-4D illustrate the same method 200 as that described previously with reference to FIGS. 3A-3D, except that the imager component 300 further includes a conductor 400 disposed between two image elements 306. As shown in the illustrated embodiments, the conductor 400 will block some of the ultraviolet light 322 during Item 204 of method 200. This will result in an extra opening 342 that is above the conductor 400 when the portion 332 of the photo-sensitive layer 310 is removed during Item 206 of the method 200. As a result, when the scintillating material 360 is deposited, there will be an extra scintillating material 360 that is above the conductor 400. However, each scintillating material 360 that is above its corresponding image element 306 is still confined by its adjacent walls 340. Thus, the method 200 will still produce the imager 300 having scintillating materials 360 above the corresponding image elements 306 and are surrounded by adjacent walls. In other embodiments, the conductor 400 may be made from a material that is transparent (or at least partially transparent) to light (e.g., UV light) so that the light may transmit therethrough to reach the layer 310. Such technique may prevent an opening from forming on top of the conductor 400.

Figure 5:
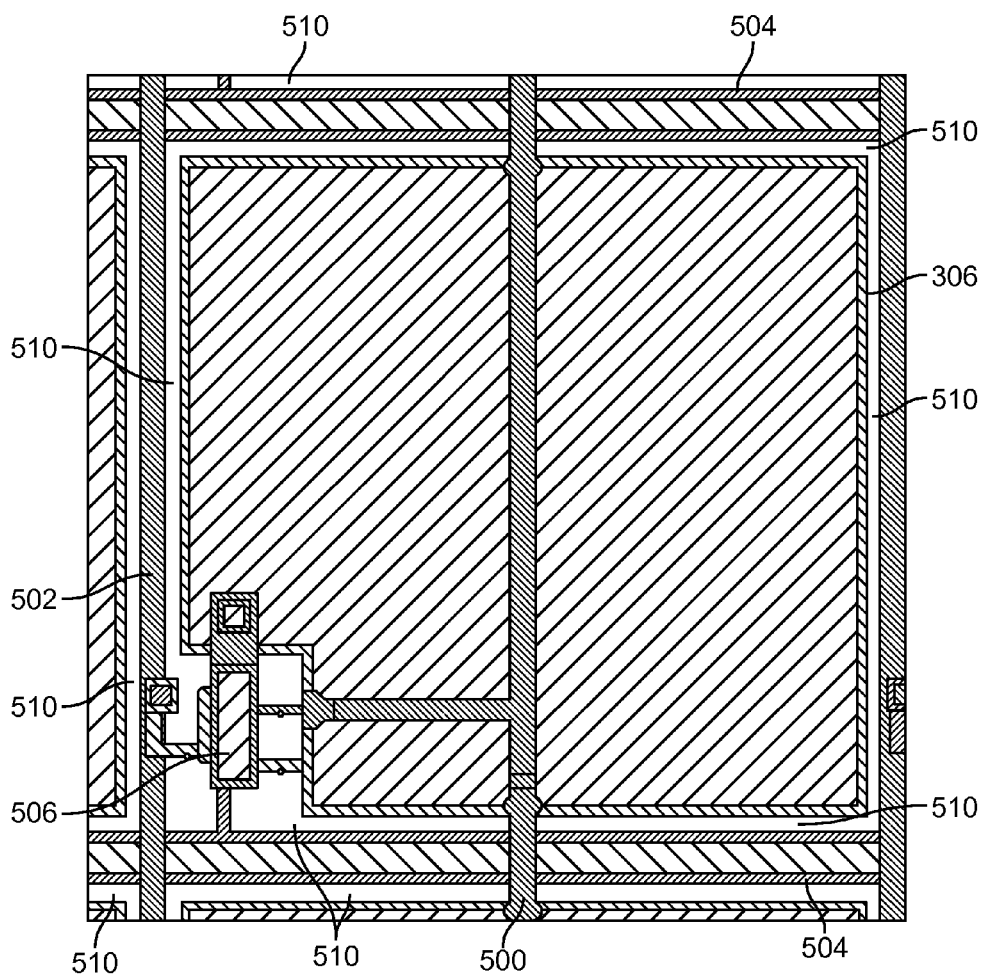
FIG. 5 illustrates a part of an imager component that has an image element, a bias line, a signal line, and data lines.
Figure 6:
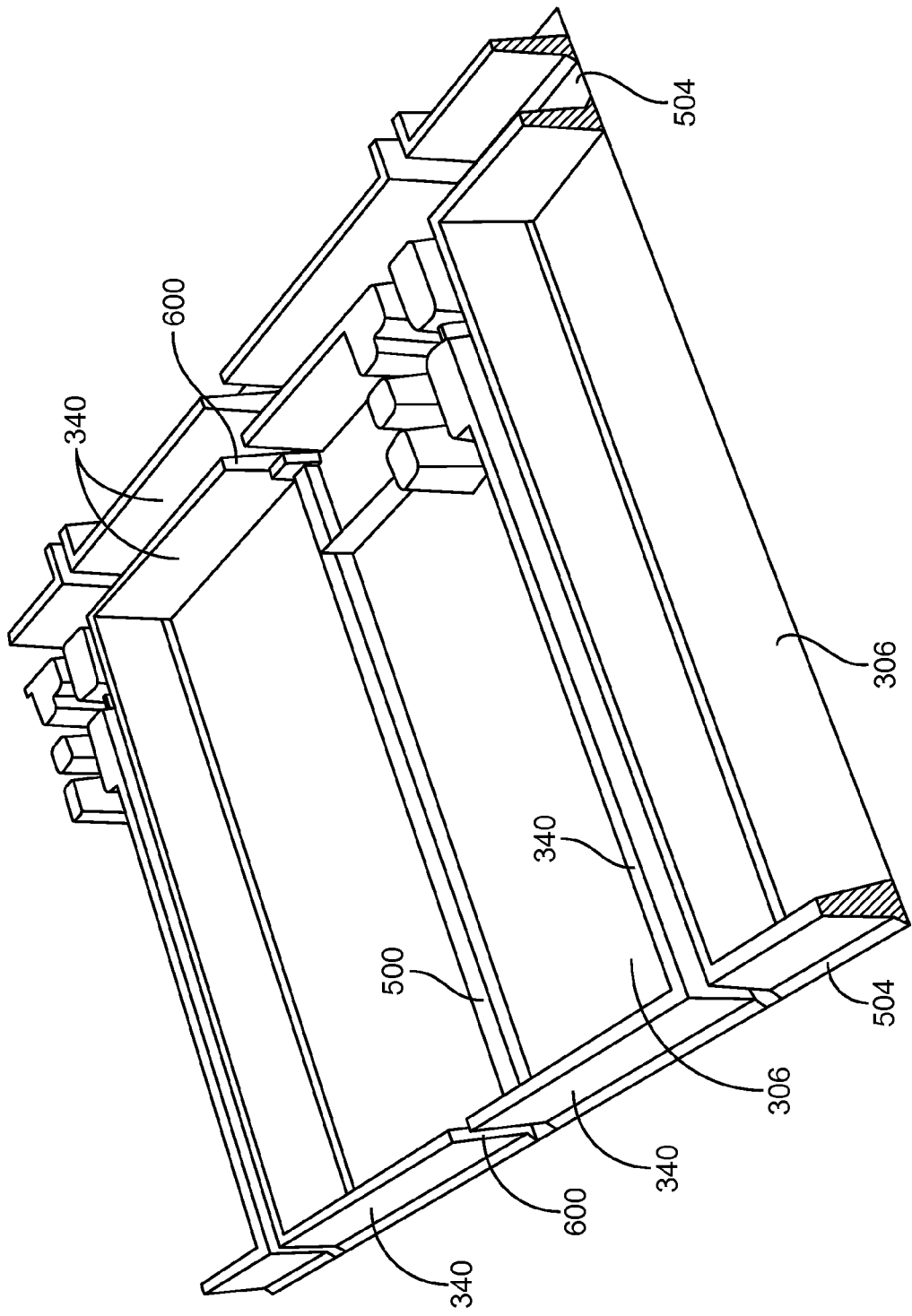
FIG. 6 illustrates a structure formed using a part of the method of FIG. 2 in accordance with some embodiments.

FIG. 5 illustrates an example of the technique illustrated in FIGS. 4A-4D. In particular, the figure shows a partial plan view of the imager component 300, which has a bias line 500, a signal line 502, and data lines 504. The image element 306 and its associating circuitry 506 are also shown. In the illustrated embodiments, circuitry 506 includes a switch that utilizes a thin film transistor (TFT). During method 200, the space 510 that is not covered by the image element 306, the circuitry 506, the bias line 500, the signal line 502, and the data lines 504, allows the ultraviolet light to pass therethrough to reach the photo-sensitive layer 310. The parts of the photo-sensitive layer 310 that receive the ultraviolet light will get cured and hardened. When the remaining parts of the photo-sensitive layer 310 that do not receive the ultraviolet light are removed, the resulting imager component 300 will have a plurality of walls 340 formed around the space 342 that is above each image element 306 (FIG. 6). As shown in FIG. 6, a wall 340 may have a slight gap 600 (resulted from the bias line 500 blocking some of the ultraviolet light). However, when the scintillating material 360 is disposed into the space 342, the scintillating material 360 will be surrounded by the walls 340 substantially (e.g., at least 80% of the circumference of the scintillating material 360 is surrounded by the walls 340).

In the above embodiments, the photo-sensitive layer 310 is a negative photo-resist for creating ridges between the pixels. In other embodiments, the photo-sensitive layer 310 may be a positive photo-resist for creating valleys between the pixels. In some embodiments, the positive photo-resist will remain, after development, in the areas that were not exposed with UV light.

It should be noted that the above technique is not limited to making imagers with a scintillating material, and that similar technique may be used to make other types of imagers. For example, in other embodiments, the imager 100 may not include any scintillating material. Instead, the imager 100 includes a conversion layer configured to generate electron-hole-pairs in response to radiation. In such cases, each image element 306 includes an electrode configured to receive the charge from the conversion layer. The conversion layer may be made pixelated using embodiments of the technique described herein. For example, in some embodiments, the image elements 306 are used as a mask for allowing a light (e.g., ultraviolet light) to interact with the photo-sensitive layer 310. When parts of the photo-sensitive layer 310 interact with the light, the parts of the photo-sensitive layer 310 cure and harden, and form walls 340. In these embodiments, the walls 340 are electrically insulative. After the walls 340 are formed, the material for the conversion layer is then deposited next to the walls. The walls form a barrier between each conversion element, thereby allowing the charge from each conversion element to be collected by the image element 306 that is below it without crossing to adjacent image element 306.

Although particular embodiments have been shown and described, it will be understood that they are not intended to limit the claimed inventions, and it will be obvious to those skilled in the art that various changes and modifications may be made without departing from the spirit and scope of the claimed inventions. The specification and drawings are, accordingly, to be regarded in an illustrative rather than restrictive sense. The claimed inventions are intended to cover alternatives, modifications, and equivalents.

What is claimed:

1. An imager having at least a portion that is formed by:
   obtaining an imager component having a substrate layer, a photo-sensitive layer, and a first image element and a second image element disposed between the substrate layer and the photo-sensitive layer;
   delivering ultraviolet light through the substrate layer and between the first image element and the second image element to reach the photo-sensitive layer, wherein the ultraviolet light interacts with a portion of the photo-sensitive layer to form a photo-resist structure;
   removing a part of the photo-sensitive layer that does not receive the ultraviolet light to create a space; and
   disposing a scintillating material in the space.

2. The imager of claim 1, wherein the act of delivering ultraviolet light comprises using the first image element and the second image element as a mask.

3. The imager of claim 1, wherein the substrate layer is transparent to ultraviolet light.

4. The imager of claim 1, wherein the scintillating material is above the first image element and is at least partially confined by the photo-resist structure.

5. The imager of claim 1, wherein the imager component further includes an electrical conductor disposed between the first image element and the second image element.

6. The imager of claim 5, wherein the ultraviolet light is delivered through a first region between the first image element and the electrical conductor, and through a second region between the electrical conductor and the second image element.

7. The imager of claim 1, wherein the photo-sensitive layer comprises a negative photo-sensitive material.

8. The imager of claim 1, wherein the photo-sensitive layer comprises a positive photo-sensitive material.

9. The imager of claim 1, wherein the photo-sensitive layer comprises SU-8.

10. The imager of claim 1, wherein the photo-sensitive layer comprises NR9-8000.

11. The imager of claim 1, wherein the photo-sensitive layer comprises AZ PLP-100.

12. The imager of claim 1, wherein the photo-resist structure has a width, and a height measured in a direction that is perpendicular to a plane of the imager that is at least half the width.

13. The imager of claim 1, wherein the first image element comprises a first photodiode, and the second image element comprises a second photodiode.

14. An imager having at least a portion that is formed by:
   obtaining an imager component having a substrate layer, a photo-sensitive layer, and a first image element and a second image element disposed between the substrate layer and the photo-sensitive layer; and
   delivering ultraviolet light through the substrate layer and between the first image element and the second image element to reach the photo-sensitive layer;

wherein the ultraviolet light interacts with a portion of the photo-sensitive layer to form a photo-resist structure; and wherein the photo-sensitive layer includes a filler that reflects a first part of a light spectrum while being transparent to a second part of the light spectrum.

15. The imager of claim 14, wherein the first part of the light spectrum comprises green light.

16. The imager of claim 14, wherein the second part of the light spectrum comprises ultraviolet light.

17. An imager, comprising:
a substrate;
an imaging layer above the substrate, wherein the imaging layer comprises a first image element and a second image element; and
a scintillating layer above the imaging layer, wherein the scintillating layer includes a plurality of walls that are in a grid configuration, and a plurality of scintillating blocks that are disposed in respective spaces between the walls;
wherein the walls are photo-resist structures.

18. The imager of claim 17, wherein at least two of the walls have a unity configuration.

19. The imager of claim 17, wherein one of the walls has a width, and a height measured in a direction that is perpendicular to a plane of the imager that is at least half the width.

20. The imager of claim 17, wherein one of the walls is configured to absorb a part of a light spectrum.

21. The imager of claim 17, wherein the first image element comprises a first photodiode, and the second image element comprises a second photodiode.

22. An imager, comprising:
a substrate;
an imaging layer above the substrate, wherein the imaging layer comprises a first image element and a second image element; and
a scintillating layer above the imaging layer, wherein the scintillating layer includes a plurality of walls that are in a grid configuration, and a plurality of scintillating blocks that are disposed in respective spaces between the walls;
wherein one of the walls is configured to reflect a first part of a light spectrum while being transparent to a second part of the light spectrum.

23. The imager of claim 22, wherein the first part of the light spectrum comprises green light.

24. The imager of claim 22, wherein the second part of the light spectrum comprises ultraviolet light.

* * * * *